United States Patent
Lundquist

(10) Patent No.: US 7,527,858 B2
(45) Date of Patent: May 5, 2009

(54) COMPOSITE MATERIALS AND METHODS OF MAKING THE SAME

(75) Inventor: Eric Gustave Lundquist, North Wales, PA (US)

(73) Assignee: Rohm and Haas Company, Philadelphia, PA (US)

( * ) Notice: Subject to any disclaimer, the term of this patent is extended or adjusted under 35 U.S.C. 154(b) by 40 days.

(21) Appl. No.: 11/529,050

(22) Filed: Sep. 28, 2006

(65) Prior Publication Data

US 2007/0077837 A1    Apr. 5, 2007

Related U.S. Application Data

(60) Provisional application No. 60/723,226, filed on Oct. 3, 2005.

(51) Int. Cl.
*B32B 17/10* (2006.01)
*B32B 27/12* (2006.01)
*C09J 7/02* (2006.01)

(52) U.S. Cl. ............... 428/339; 428/337; 442/149; 442/150

(58) Field of Classification Search ........... 442/149, 442/150; 428/137, 297.4, 295.1, 301.4, 337, 428/339

See application file for complete search history.

(56) References Cited

U.S. PATENT DOCUMENTS

| | | | |
|---|---|---|---|
| 3,085,986 | A | 4/1963 | Muskat |
| 5,318,990 | A | 6/1994 | Strauss |
| 5,661,213 | A | 8/1997 | Arkens et al. |
| 6,071,994 | A | 6/2000 | Hummerich et al. |
| 2002/0117279 | A1 | 8/2002 | Wertz et al. |
| 2004/0034154 | A1* | 2/2004 | Tutin et al. ............ 524/538 |
| 2004/0115429 | A1 | 6/2004 | Schoemann |
| 2006/0111480 | A1 | 5/2006 | Hansen et al. |
| 2007/0010651 | A1* | 1/2007 | Finch et al. ............ 528/310 |

FOREIGN PATENT DOCUMENTS

| | | |
|---|---|---|
| DE | 19956420 | 3/2001 |
| EP | 1510618 | 3/2005 |
| WO | WO9961384 | 12/1999 |

* cited by examiner

*Primary Examiner*—Lynda Salvatore
(74) *Attorney, Agent, or Firm*—Andrew G. Bunn

(57) ABSTRACT

Composite materials that contain formaldehyde-free, cured binder compositions are disclosed. Also disclosed are methods of making and using composite materials containing formaldehyde-free binder compositions.

17 Claims, No Drawings

COMPOSITE MATERIALS AND METHODS OF MAKING THE SAME

This application claims the benefit of U.S. patent application No. 60/723,226 filed on Oct. 03, 2005.

The present invention relates to composite materials and methods of making the same. In particular, the present invention relates to composite materials and to methods of making said materials with a formaldehyde-free binder composition.

The preparation of composite materials, for example, fiber structures (e.g., nonwoven fiber insulation) and shaped articles (e.g., fiberboard and chipboard) are conventionally made using phenol-formaldehyde (PF) resins or phenol-formaldehyde resins extended with urea (PFU).

One perceived concern with the use of PF or PFU resins is the potential for formaldehyde emissions during preparation of the resins, during manufacture of composite materials comprising the resins and during subsequent use of those composite materials.

One alternative to PF or PFU resins is disclosed in United States Patent Application Publication No. 2004/0115429 to Michl et al. Michl et al. disclose a process of binding fibrous and/or granular substrates, which process comprises the mixing of a) a pulverulent formaldehyde-free binder composition containing: (i) a pulverulent copolymer polymerized from maleic anhydride and at least one α-olefin and/or styrene as part A; and also (ii) at least one pulverulent crosslinker which has two or more reactive groups capable of reacting with the carbonyl groups of maleic anhydride, as part B; and also, (iii) optionally further additive materials; and, b) a fibrous and/or granular substrate; and, c) binding the substrate by heating in the presence or absence of at least one catalyst.

Nevertheless, there remains a need for identifying new methods of making composite materials that are formaldehyde-free using formaldehyde-free binder compositions.

In one aspect of the present invention, there is provided a composite material comprising: (a) a substrate material selected from fibers, slivers, chips and combinations thereof; and,(b) a cured binder composition, wherein the cured binder composition is produced from an aqueous binder composition comprising an aqueous solvent, component X and a binder polymer polymerized from component Y and optional component Z; where component X is at least one base; and, where component Z is selected from styrene, a styrene derivative, an alkyl(meth)acrylate, an α-olefin, an α-olefin derivative and a combination thereof; and, wherein the composite material comprises $\leq 40$ wt % cured binder composition and wherein at least 40 mol % of the component Y derived units in the cured binder composition contribute at least one carbonyl group that forms part of a cyclic anhydride group, a maleimide group, a substituted maleimide group, or an amide group in the cured binder composition.

In another aspect of the present invention, there is provided a composite material comprising: (a) a substrate material selected from fibers, slivers, chips and combinations thereof; and, (b) a cured binder composition, wherein the cured binder composition is produced from an aqueous binder composition comprising an aqueous solvent, component A and a binder polymer polymerized from component Y and optional component Z; where component X is selected from ammonia, ammonium hydroxide, methyl amine, ethyl amine, propyl amine, butyl amine, sodium hydroxide, potassium hydroxide, tetramethylammonium hydroxide and combinations thereof; where component Y is at least one of a cyclic anhydride, a maleimide and a substituted maleimide; and, where component Z is selected from styrene, a styrene derivative, an alkyl (meth)acrylate, an α-olefin, an α-olefin derivative and a combination thereof; and, wherein the composite material comprises $\leq 40$ wt % cured binder composition.

In another aspect of the present invention, there is provided a product comprising a composite material of the present invention.

In another aspect of the present invention, there is provided a method for preparing a composite material, comprising: (a) providing an aqueous binder composition, wherein the aqueous binder composition comprises an aqueous solvent, component X and a binder polymer polymerized from component Y and optional component Z; where component X is at least one base; where component Y is at least one of a cyclic anhydride, a maleimide and a substituted maleimide; and, where component Z is selected from styrene, a styrene derivative, an alkyl(meth)acrylate, an α-olefin, an α-olefin derivative and a combination thereof; wherein the pH of the aqueous binder composition is >6; (b) providing a substrate material selected from fibers, slivers, chips and combinations thereof; (c) treating the substrate material with the aqueous binder composition; and, (d) curing the aqueous binder composition; wherein the composite material comprises $\leq 40$ wt % of the cured binder composition.

The term "copolymer" as used herein and in the appended claims refers to polymers polymerized from at least two different monomers.

The term "terpolymer" as used herein and in the appended claims refers to polymers polymerized from at least three different monomers.

The term "curing" as used herein and in the appended claims means a chemical or morphological change which is sufficient to alter the properties of the binder composition such as, for example, via covalent chemical reaction (e.g., crosslinking), ionic interaction or clustering, improved adhesion to the substrate material, phase transformation or inversion, hydrogen bonding, and combinations thereof.

The term "aqueous" as used herein and in the appended claims means water and mixtures composed substantially of water and water miscible solvents.

The term "formaldehyde-free" as used herein and in the appended claims refers to a composition that is substantially free from formaldehyde, and does not liberate a substantial amount of formaldehyde during drying and/or curing. Typically, less than 1 part per million formaldehyde, based on the weight of the composition, is present in a formaldehyde-free composition.

The term "(meth)acrylic" used herein and in the appended claims encompasses both methacrylic and acrylic.

The term "(meth)acrylate" used herein and in the appended claims encompasses both methacrylate and acrylate.

In some embodiments of the present invention, the composite material comprises 0.5 to 40 wt %, alternatively 1 to 40 wt %, alternatively 1 to 30 wt %, alternatively <25 wt %, alternatively 1 to 20 wt %, alternatively 5 to 15 wt % of the cured binder composition.

In some embodiments of the present invention, the cured binder composition contains 0 to <5 wt %; alternatively 0 to $\leq 4$ wt %; alternatively 0 to $\leq 3$ wt %; alternatively 0 to $\leq 2.5$ wt %; alternatively 0 to $\leq 2$ wt %; alternatively 0 to $\leq 1$ wt %; alternatively 0 to $\leq 0.5$ wt %; alternatively 0 to $\leq 0.1$ wt % (based on solids) of units derived from a crosslinking agent, wherein the crosslinking agent is a material other than component Y and optional component Z that contains at least two reactive groups capable of reacting with the carbonyl groups of the at least one cyclic anhydride of component Y.

In some embodiments of the present invention, the substrate material is selected from fibers, slivers, chips and combinations thereof. In some aspects of these embodiments, the substrate material is "heat resistant". The term "heat resistant" used herein and in the appended claims, in reference to a substrate material, means that the substrate material is substantially unaffected by exposure to temperatures $\geqq 100°$ C., alternatively $\geqq 120°$ C., alternatively from 100° C. to 350° C.; for a period of at least 3 seconds; alternatively of at least 30 minutes.

In some embodiments of the present invention, the composite material is fibers. In some aspects of these embodiments, the fibers are selected from natural fibers (e.g., sisal, jute, hemp, flax, cotton, coconut fibers, banana fibers); animal fibers (e.g., wool, hair); plastic fibers (e.g., polypropylene fibers, polyethylene fibers, polyvinyl chloride fibers, polyester fibers, polyamide fibers, polyacrylonitrile fibers); glass fibers; glass wool; mineral fibers; mineral wool; synthetic inorganic fibers (e.g., aramid fibers, carbon fibers); and combinations thereof. In some aspects of these embodiments, the fibers may include cellulose fibers, cellulose acetate fibers and fibers of esters and ethers of cellulose. In some aspects of these embodiments, the fibers are selected from mineral fibers, aramid fibers, ceramic fibers, metal fibers, carbon fibers, polyimide fibers, polyester fibers, rayon fibers, glass fibers, glass wool, mineral wool and combinations thereof. In some aspects of these embodiments, the fibers are selected from glass fibers, glass wool, mineral wool and combinations thereof. In some aspects of these embodiments, the fibers are glass fibers. In some aspects of these embodiments, the fibers are heat resistant.

In some embodiments of the present invention, the substrate material is selected from fibers, slivers, chips and combinations thereof, wherein the fibers, slivers and chips are comprised of wood, metal, metal oxides, plastic, minerals, glass and combinations thereof. In some aspects of these embodiments, the fibers, slivers, chips and combinations thereof are heat resistant.

In some embodiments of the present invention, component Y is at least one of a cyclic anhydride, a maleimide and a substituted maleimide. In some aspects of these embodiments, component Y is at least one of maleic anhydride, itaconic anhydride, citraconic anhydride, maleimide and substituted maleimide. In some aspects of these embodiments, component Y is maleic anhydride. In some aspects of these embodiments, component Y is itaconic anhydride. In some aspects of these embodiments, component Y is citraconic anhydride. In some aspects of these embodiments, component Y is maleimide.

In some embodiments of the present invention, component Z is selected from styrene, a styrene derivative, an alkyl (meth)acrylate, an α-olefin, an α-olefin derivative and combinations thereof. In some aspects of these embodiments, component Z is selected from a $C_2$-$C_{32}$ α-olefin, styrene, a styrene derivative, an alkyl(meth)acrylate and combinations thereof. In some aspects of these embodiments, component Z is selected from a $C_2$-$C_{16}$ α-olefin, styrene, a styrene derivative, an alkyl(meth)acrylate and combinations thereof. In some aspects of these embodiments, component Z is selected from a $C_2$-$C_8$ α-olefin, styrene, a styrene derivative, an alkyl (meth)acrylate and combinations thereof. In some aspects of these embodiments, component Z is selected from isobutene, diisobutene, styrene and combinations thereof.

In some embodiments of the present invention, the binder polymer is a styrene/maleic anhydride copolymer.

In some embodiments of the present invention, the binder polymer is an isobutylene/maleic anhydride copolymer.

In some embodiments of the present invention, the binder polymer is an isobutylene/maleic anhydride/maleimide terpolymer.

In some embodiments of the present invention, the binder polymer is a polymaleic anhydride polymer.

In some embodiments of the present invention, component X helps to raise the pH of the aqueous binder composition. In some aspects of these embodiments, a sufficient quantity of component X is added to provide an aqueous binder composition with a pH $\geqq 6$; alternatively 6 to 12; alternatively 7 to 12; alternatively 8 to 10.

In some embodiments of the present invention, component X helps facilitate the solubility or dispersibility in aqueous solution of the binder polymer.

In some embodiments of the present invention, component X is added to the aqueous binder composition following polymerization of component Y and optional component Z to form the binder polymer.

In some embodiments of the present invention, component X is at least one base. In some aspects of these embodiments, component X is at least one base selected from ammonia; ammonium hydroxide; methyl amine; ethyl amine; propyl amine; dipropanol amine; butyl amine; 2-amino-2-methyl amine; 2-amino-1-butanol; 2-amino-2-ethyl-1,3-propanediol; 2-amino-2-methyl-1,3-propanediol; ethanol amine; diethanol amine; triethanol amine; tris(hydroxymethyl)-aminomethane; an amino silane; sodium hydroxide; potassium hydroxide and tetramethylammonium hydroxide. In some aspects of these embodiments, component X is at least one base selected from ammonia, ammonium hydroxide, methyl amine, ethyl amine, propyl amine, butyl amine, sodium hydroxide, potassium hydroxide, tetramethylammonium hydroxide.

In some embodiments of the present invention, the aqueous binder composition comprises 0 to 95 wt %, alternatively 10 to 80 wt %, alternatively 20 to 60 wt %, alternatively 40 to 60 wt % (based on solids) of component X.

In some embodiments of the present invention, the aqueous binder composition may further comprise a crosslinking agent. In some aspects of these embodiments, the aqueous binder composition comprises 0 to 95 wt %; alternatively 10 to 80 wt %; alternatively 20 to 60 wt %; alternatively 40 to 60 wt %; alternatively 0 to <5 wt %; alternatively 0 to $\leqq 4$ wt %; alternatively 0 to $\leqq 3$ wt %; alternatively 0 to $\leqq 2.5$ wt %; alternatively 0 to $\leqq 2$ wt %; alternatively 0 to $\leqq 1$ wt %; alternatively 0 to $\leqq 0.5$ wt %; alternatively 0 to $\leqq 0.1$ wt % (based on solids) of crosslinking agent (based on solids) of crosslinking agents. In some aspects of these embodiments, the aqueous binder composition may further comprise a crosslinking agent selected from hydroxyamides, ethylene diamine, lysine, epoxides, amino alcohols, oxazolines, polyamines, oxazolidines, glycerol carbonate, propylene carbonate, poly butanediol bis(amino benzoate), diethylene triamine and combinations thereof.

In some embodiments of the present invention, the binder composition may further comprise a silane coupling agent. Silane coupling agents suitable for use with the present invention include any conventional silane coupling agents compatible with the step-reaction copolymer and the substrate material. In some aspects of these embodiments, the binder composition may comprise 0.05 to 2 wt %, alternatively 0.1 to 2 wt %, 0.1 to 0.5 wt % (based on binder solids) of silane coupling agent. In some aspects of these embodiments, the silane coupling agent is selected from aminopropyl silanes, trimethoxy silanes, epoxy containing silanes and combinations thereof. Some representative silane coupling agents include, for example, the organo silicon oils available from Dow-Corning Corporation; A0700, A0750 and A0800 available from Petrarch Systems; A1160 available from Dow Chemical Corporation; Silquest™ A-187 available from GE Silicones—OSi Specialties; and combinations thereof.

In some embodiments of the present invention, the binder composition may further comprise an additive. Additives suitable for use with the present invention include any conventional additives compatible with the step-reaction copolymer and the substrate material. In some aspects of these embodiments, the binder composition may further comprise an optional additive, wherein the additive is selected from accelerators (e.g., phosphorous-containing accelerators); emulsifiers; pigments; fillers; extenders (e.g., urea and carbohydrates such as cellulose and sugar); antimigration aids; curing agents; coalescents; surfactants (e.g., ionic surfactants, nonionic surfactants and zwitterionic surfactants); spreading agents; dust suppressing agents (e.g., mineral oil dust suppressing agents); biocides; plasticizers; organosilanes; antifoaming agents (e.g., dimethicones, silicone oils and ethoxylated nonionics); corrosion inhibitors (e.g., corrosion inhibitors effective at pH<4, e.g., thioureas, oxalates and chromates); colorants; antistatic agents; lubricants; waxes; antioxidants; coupling agents (e.g., organo silicon oils available from Dow-Corning Corporation; A0700, A0750 and A0800 available from Petrarch Systems; A1160 available from Dow Chemical Corporation and Silquest™ A-187 available from GE Silicones—OSi Specialties); polymers; waterproofing agents (e.g., silicones and emulsion polymers, such as emulsion polymers containing, as copolymerized units, greater than 30 wt %—based on the weight of the emulsion polymer solids—ethylenically unsaturated acrylic monomer containing a $C_4$ or greater alkyl group); wetting agents; lignin; and, combinations thereof.

In some embodiments of the present invention, the aqueous binder composition may further comprise an emulsion polymer. The term "emulsion polymer" used herein and in the appended claims refers to polymers dispersed in an aqueous medium and that have been prepared by an emulsion polymerization technique. In some aspects of these embodiments, the emulsion polymer may be selected from, for example a copolymer comprising polymerized ethylenically unsaturated (meth)acrylic monomers.

In some embodiments of the present invention, the binder polymer comprises a 1:0 to 1:3 molar ratio of component Y to optional component Z. In some aspects of these embodiments, the binder polymer comprises a 1:0.01 to 1:3 molar ratio of component Y to component Z. In some aspects of these embodiments, the binder polymer comprises a 1:0.1 to 1:3 molar ratio of component Y to component Z. In some aspects of these embodiments, the binder polymer comprises a 1:0.5 to 1:3 molar ratio of component Y to component Z. In some aspects of these embodiments, the binder polymer comprises a 1:1 to 1:3 molar ratio of component Y to component Z. In some aspects of these embodiments, the binder polymer comprises a 1:1 to 1:2 molar ratio of component Y to component Z. In some aspects of these embodiments, the binder polymer comprises a 1:1 to 1:<2 molar ratio of component Y to component Z.

In some embodiments of the present invention, the aqueous binder composition comprises a 1:≧0.6 molar ratio of component Y to component X. In some aspects of these embodiments, the aqueous binder composition comprises a 1:0.6 to 1:3 molar ratio of component Y to component X. In some aspects of these embodiments, the aqueous binder composition comprises a 1:>0.6 to 1:3 molar ratio of component Y to component X. In some aspects of these embodiments, the aqueous binder composition comprises a 1:0.7 to 1:2 molar ratio of component Y to component X. In some aspects of these embodiments, the aqueous binder composition comprises a 1:0.8 to 1:2 molar ratio of component Y to component X. In some aspects of these embodiments, the aqueous binder composition comprises a 1:0.9 to 1:2 molar ratio of component Y to component X. In some aspects of these embodiments, the aqueous binder composition comprises a 1:1 to 1:<2 molar ratio of component Y to component X.

In some embodiments of the present invention, the binder polymer has a weight average molecular weight, $M_w$, of ≦100,000; alternatively 100 to 100,000; alternatively 1,000 to 75,000; alternatively 2,500 to 50,000; alternatively 2,500 to 20,000.

In some embodiments of the present invention, the aqueous binder composition comprises 1 to 80 wt % solids. In some aspects of these embodiments, the aqueous binder composition comprises 2 to 50 wt %; alternatively 3 to 30 wt %; alternatively 4 to 10 wt % solids.

In some embodiments of the present invention, the aqueous binder composition does not comprise a phosphorous-containing accelerator.

In some embodiments of the present invention, the aqueous binder composition does contain a phosphorous-containing accelerator.

In some embodiments of the present invention, at least 40 mol % of the component Y derived units in the cured binder composition contribute at least one carbonyl group that forms part of a cyclic anhydride group, a maleimide group, a substituted maleimide group or an amide group in the cured binder composition. In some aspects of these embodiments, at least 50 mol %; alternatively at least 60 mol %; alternatively at least 70 mol %; alternatively at least 75 mol %; alternatively at least 80 mol %; alternatively at least 90 mol %; alternatively at least 95 mol %; alternatively at least 97 mol %; alternatively at least 98 mol %; alternatively at least 99 mol %; of the component Y derived units in the cured binder composition contribute at least one carbonyl group that forms part of a cyclic anhydride group, a maleimide group, a substituted maleimide group or an amide group in the cured binder composition.

In some embodiments of the present invention, the cured binder composition provides a strong bond with sufficient elasticity and thickness recovery to permit reasonable shipping and in-service deformation of the composite material.

In some embodiments of the present invention, the composite material is moisture resistant so that it does not swell under humid conditions.

In some embodiments of the present invention, the binder composition is odor free and non-corrosive to metals it contacts during processing to prepare the composite materials of the present invention.

In some embodiments of the present invention, the binder composition is formaldehyde-free.

In some embodiments of the present invention, the composite material is formaldehyde-free.

In some embodiments of the present invention, the method for preparing the composite material, comprises: (a) providing an aqueous binder composition, wherein the aqueous binder composition comprises an aqueous solvent, component X and a binder polymer polymerized from component Y and optional component Z; where component Y is at least one of a cyclic anhydride, a maleimide and a substituted maleimide. In some aspects of these embodiments, component Y is maleic anhydride. In some aspects of these embodiments, component Y is itaconic anhydride. In some aspects of these embodiments, component Y is citraconic anhydride. In some aspects of these embodiments, component Y is maleimide. In some aspects of these embodiments, component Y is a substituted maleimide.

In some embodiments of the present invention, the method of preparing the composite material, comprises: (a) providing an aqueous binder composition, wherein the aqueous binder composition comprises an aqueous solvent, component X and a binder polymer polymerized from component Y and optional component Z; wherein component Z is at least one of styrene, a styrene derivative, an alkyl(meth)acrylate, an α-olefin and an α-olefin derivative. In some aspects of these embodiments, component Z is at least one of a $C_2$-$C_{32}$ α-olefin, styrene, a styrene derivative and an alkyl(meth)acrylate. In some aspects of these embodiments, component Z is at least one of a $C_2$-$C_{16}$ α-olefin, styrene, a styrene derivative and an alkyl(meth)acrylate. In some aspects of these embodiments, component Z is at least one of a $C_2$-$C_8$ α-olefin, styrene, a styrene derivative and an alkyl(meth)acrylate. In some aspects of these embodiments, component Z is at least one of isobutene, diisobutylene, methoxy ethene, styrene, a styrene derivative and an alkyl(meth)acrylate. In some aspects of these embodiments, component Z is at least one of isobutene, diisobutylene, methoxy ethene and styrene.

In some embodiments of the present invention, the method of preparing the composite material, comprises: (a) providing an aqueous binder composition, wherein the aqueous binder composition comprises an aqueous solvent, component X and a binder polymer, wherein the binder polymer is a styrene/maleic anhydride copolymer.

In some embodiments of the present invention, the method of preparing the composite material, comprises: (a) providing an aqueous binder composition, wherein the aqueous binder composition comprises an aqueous solvent, component X and a binder polymer, wherein the binder polymer is an isobutylene/maleic anhydride copolymer.

In some embodiments of the present invention, the method of preparing the composite material, comprises: (a) providing an aqueous binder composition, wherein the aqueous binder composition comprises an aqueous solvent, component X and a binder polymer, wherein the binder polymer is an isobutylene/maleic anhydride/maleimide terpolymer.

In some embodiments of the present invention, the method of preparing the composite material, comprises: (a) providing an aqueous binder composition, wherein the aqueous binder composition comprises an aqueous solvent, component X and a binder polymer, wherein the binder polymer is a polymaleic anhydride polymer.

In some embodiments of the present invention, the method of preparing the composite material, comprises: (a) providing an aqueous binder composition, wherein the aqueous binder composition comprises an aqueous solvent, component X and a binder polymer polymerized from component Y and optional component Z; wherein component X is at least one of base. In some aspects of these embodiments, component X is at least one base selected from ammonia; ammonium hydroxide; methyl amine; ethyl amine; propyl amine; dipropanol amine; butyl amine; 2-Amino-2-methyl amine; 2-amino-1-butanol; 2-Amino-2-ethyl-1,3-propanediol; ethanol amine; diethanol amine; triethanol amine; 2-Amino-2-methyl-1,3-propanediol; tris(hydroxymethyl)-aminomethane; an amino silane; sodium hydroxide; potassium hydroxide and tetramethylammonium hydroxide. In some aspects of these embodiments, component X is at least one base selected from ammonia, ammonium hydroxide, methyl amine, ethyl amine, propyl amine, butyl amine, sodium hydroxide, potassium hydroxide and tetramethylammonium hydroxide.

In some embodiments of the present invention, the water present in the aqueous binder composition may be substantially removed during processing to prepare the composite material. The removal of the water (drying) may take place in succession with curing or simultaneously with curing. That is, the drying and curing of the aqueous binder composition may occur in one process step or in two or more distinct process steps.

In some embodiments of the present invention, the method comprises adding a crosslinking agent to the aqueous binder composition. In some aspects of these embodiments, the aqueous binder composition comprises 0 to 95 wt %; alternatively 10 to 80 wt %; alternatively 20 to 60 wt %; alternatively 40 to 60 wt %; alternatively 0 to <5 wt %; (based on solids) of crosslinking agent. In some aspects of these embodiments, the crosslinking agent is selected from hydroxyamides, ethylene diamine, lysine, epoxides, oxazolines, polyamines, amino alcohols, oxazolidines, glycerol carbonate, propylene carbonate, poly butanediol bis(amino benzoate), diethylene triamine and combinations thereof.

In some embodiments of the present invention, the method of preparing the composite material, comprises: (a) providing an aqueous binder composition, wherein the aqueous binder composition comprises an aqueous solvent, component X and a binder polymer, wherein the binder polymer comprises a 1:0 to 1:3 molar ratio of component Y to optional component Z. In some aspects of these embodiments, the binder polymer comprises a 1:0.01 to 1:3 molar ratio of component Y to component Z. In some aspects of these embodiments, the binder polymer comprises a 1:0.1 to 1:3 molar ratio of component Y to component Z. In some aspects of these embodiments, the binder polymer comprises a 1:0.5 to 1:3 molar ratio of component Y to component Z. In some aspects of these embodiments, the binder polymer comprises a 1:1 to 1:3 molar ratio of component Y to component Z. In some aspects of these embodiments, the binder polymer comprises a 1:1 to 1:2 molar ratio of component Y to component Z. In some aspects of these embodiments, the binder polymer comprises a 1:1 to 1:<2 molar ratio of component Y to component Z.

In some embodiments of the present invention, the method comprises providing an aqueous binder composition comprising 1 to 80 wt % solids. In some aspects of these embodiments, the aqueous binder composition comprises 2 to 50 wt % solids; alternatively 3 to 30 wt % solids; alternatively 4 to 10 wt % solids.

In some embodiments of the present invention, the method of preparing the composite material, comprises: (a) providing an aqueous binder composition, wherein the aqueous binder composition comprises an aqueous solvent, component X and a binder polymer polymerized from component Y and optional component Z; wherein the aqueous binder composition comprises a 1:>0.6 molar ratio of component Y to component X. In some aspects of these embodiments, the aqueous binder composition comprises a 1:0.6 to 1:3 molar ratio of component Y to component X. In some aspects of these embodiments, the aqueous binder composition comprises a 1:>0.6 to 1:3 molar ratio of component Y to component X. In some aspects of these embodiments, the aqueous binder composition comprises a 1:0.7 to 1:2 molar ratio of component Y to component X. In some aspects of these embodiments, the aqueous binder composition comprises a 1:0.8 to 1:2 molar ratio of component Y to component X. In some aspects of these embodiments, the aqueous binder composition comprises a 1:0.9 to 1:2 molar ratio of component Y to component X. In some aspects of these embodiments, the aqueous binder composition comprises a 1:1 to 1:<2 molar ratio of component Y to component X.

In some embodiments of the present invention, the method further comprises: adding a silane coupling agent to the aqueous binder composition. In some aspects of these embodiments, a sufficient amount of the silane coupling agent is added to the aqueous binder composition to provide a binder composition comprising 0.05 to 2 wt %, alternatively 0.1 to 2 wt %, 0.1 to 0.5 wt % (based on solids) of silane coupling agent.

In some embodiments of the present invention, the method further comprises: adding an additive to the aqueous binder composition, wherein the additive is selected from any conventional additives compatible with the aqueous binder composition and the substrate material. In some aspects of these embodiments, the method further comprises: adding an additive to the aqueous binder composition, wherein the additive is selected from accelerators (e.g., phosphorous-containing accelerators); emulsifiers; pigments; fillers; extenders (e.g., urea and carbohydrates such as cellulose and sugar); antimigration aids; curing agents; coalescents; surfactants (e.g., nonionic surfactants); spreading agents; dust suppressing agents (e.g., mineral oil dust suppressing agents); biocides; plasticizers; organosilanes; antifoaming agents (e.g., dimethicones, silicone oils and ethoxylated nonionics); corrosion inhibitors (e.g., corrosion inhibitors effective at pH<4, e.g., thioureas, oxalates and chromates); colorants; antistatic agents; lubricants; waxes; antioxidants; coupling agents (e.g., organo silicon oils available from Dow-Corning Corporation; A0700, A0750 and A0800 available from Petrarch Systems; A1160 available from Dow Chemical Corporation and Silquest™ A-187 available from GE Silicones—OSi Specialties); polymers; waterproofing agents (e.g., silicones and emulsion polymers, such as emulsion polymers containing, as copolymerized units, greater than 30 wt %—based on the weight of the emulsion polymer solids—ethylenically unsaturated acrylic monomer containing a $C_4$ or greater alkyl group); wetting agents; lignin; and, combinations thereof.

In some embodiments of the present invention, the method of preparing the composite material, comprises: (a) providing an aqueous binder composition, wherein the aqueous binder composition comprises an aqueous solvent, component X and a binder polymer polymerized from component Y and optional component Z; wherein the aqueous binder composition does not comprise a phosphorous-containing accelerator.

In some embodiments of the present invention, the method of preparing the composite material, comprises (a) providing an aqueous binder composition, wherein the aqueous binder composition comprises an aqueous solvent, component X and a binder polymer polymerized from component Y and optional component Z; wherein the aqueous binder composition comprises ≧0.5 wt % (based on solids) of a phosphorous-containing accelerator. In some aspects of these embodiments, the aqueous binder composition comprises ≧1 wt %; alternatively 1 to 10 wt % (based on solids) of a phosphorous-containing accelerator.

In some embodiments of the present invention, the aqueous binder composition is applied to the substrate material for the purpose of coating the substrate material, sizing the substrate material, saturating the substrate material, bonding the substrate material or a combination thereof.

In some embodiments of the present invention, the aqueous binder composition is applied to the substrate material by conventional techniques including, for example, air or airless spraying, padding, saturating, roll coating, curtain coating, beater deposition, coagulation and combinations thereof.

In some embodiments of the present invention, the aqueous binder composition is applied to the substrate material in a sufficient amount such that the cured binder composition constitutes 0.5 to 40 wt %, alternatively 1 to 40 wt %, alternatively 1 to 30 wt %, alternatively 1 to 20 wt %, alternatively 5 to 15 wt % of the composite material.

In some embodiments of the present invention, the aqueous binder composition is dried and/or cured in (d) by subjecting the product of (c) to a temperature above 80° C., alternatively 80 to 200° C., alternatively 80 to 150° C., alternatively 80 to 100° C.; for a period of ≧3 seconds, alternatively 3 seconds to 30 minutes, alternatively 3 seconds to 15 minutes.

In some embodiments of the present invention, the binder composition is sufficiently stable to facilitate preparation of the binder composition ≧4 hours before application to the substrate material.

In some embodiments of the present invention, the composite material of the present invention may be used as, or in, a variety of products. In some aspects of these embodiments, these products may include, for example, insulation, reinforcing mat for roofing or flooring applications, roving, microglass based material for printed circuit boards, microglass based material for battery separators, filter stock, tape stock, reinforcement scrim for cementitious or non-cementitious masonry coatings, ceiling tiles, cellulosic roofing tiles, window treatments and wall coverings. In some aspects of these embodiments, the product is selected from chipboard, fiberboard, automotive interior lining, insulating material and fiber web material. In some aspects of these embodiments, the product is a "heat resistant product". The term "heat resistant product" as used herein and in the appended claims refers to a product that contains a heat resistant substrate material. In some aspects of these embodiments, the heat resistant product is a "heat resistant fiber insulation product". The term "heat resistant fiber insulation product" as used herein and in the appended claims refers to an insulation product that contains a heat resistant fiber substrate material. In some aspects of these embodiments, the heat resistant fiber insulation product is provided in the form of a mat or blanket. The terms "mat" and "blanket" are used herein and in the appended claims to embrace heat resistant fiber containing composite materials exhibiting a range of different thicknesses and densities. In some embodiments, these mats or blankets may comprise entangling short staple fibers, long continuous fibers or combinations thereof.

Without wishing to be bound by theory, it is believed that in the aqueous binder composition component Y derived units in the binder polymer react with component X, resulting in a reduction in the $T_g$ of the binder polymer polymerized from component Y and optional component Z. When the aqueous binder composition is subsequently dried/cured it reacts resulting in an increase in the $T_g$. For example, see reaction schemes 1-3).

Scheme 1:

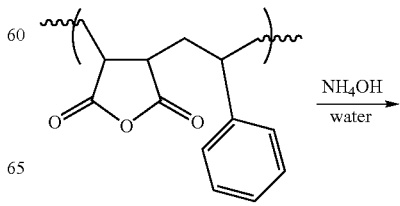

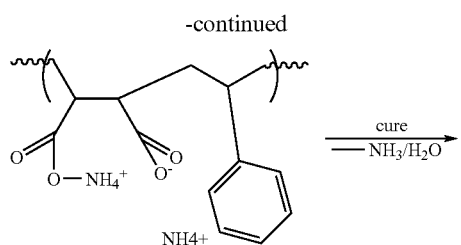

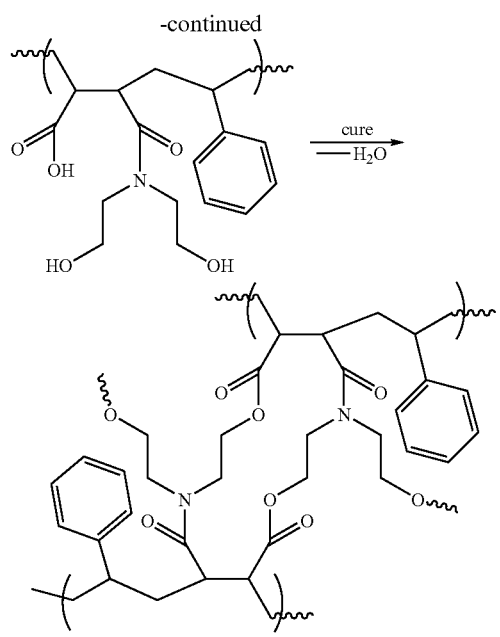

Scheme 2:

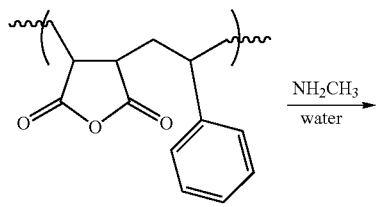

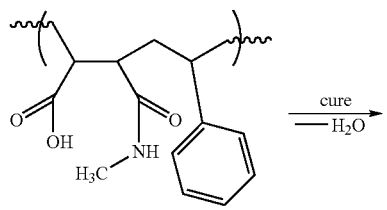

Scheme 3:

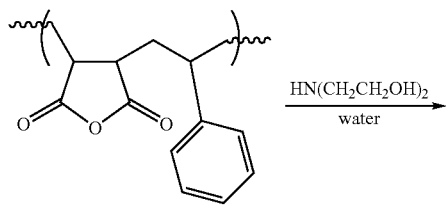

Some embodiments of the present invention will now be described in detail in the following Examples. All fractions and percentages set forth below in the Examples are by weight unless otherwise specified.

EXAMPLE 1

Synthesis of Aqueous Binder Composition

To a 500 ml, four necked flask containing a stirrer was added 100 grams of DI water, 100 grams of a 1:1 styrene/maleic anhydride copolymer (having a number average molecular weight, $M_n$, of 1,600) and 100 grams of 27% aqueous solution of ammonium hydroxide. This mixture was stirred overnight to give complete dissolution. The pH of this solution was 10.

EXAMPLE 2

Synthesis of Aqueous Binder Composition

To a 500 ml, four necked flask containing a stirrer was added 100 grams of DI water, 100 grams of a 1:1 isobutylene/maleic anhydride copolymer (having a number average molecular weight, $M_n$, of 1,700 and a weight average molecular weight, $M_w$, of 6,000) and 100 grams of a 27% aqueous solution of ammonium hydroxide. This mixture was stirred overnight to give complete dissolution. The pH of this solution was 10.

EXAMPLE 3

Synthesis of Aqueous Binder Composition

To a 500 ml, four necked flask containing a stirrer was added 100 grams of DI water, 100 grams of a 1:0.5:0.5 isobutylene/maleic anhydride/maleimide terpolymer (having a weight average molecular weight, $M_w$, of 60,000) and 100 grams of a 27% aqueous solution of ammonium hydroxide. This mixture was stirred overnight to give complete dissolution. The pH of this solution was 10.

EXAMPLE 4

Synthesis of Aqueous Binder Composition

To a 10 gram sample of Example 1 was added 1.10 grams of lysine.

EXAMPLE 5

Synthesis of Aqueous Binder Composition

To a 10 gram sample of Example 1 was added 1.5 grams of a hydroxyalkyl amide produced from the reaction of butyrolactone and diethanol amine.

EXAMPLE 6

Synthesis of Aqueous Binder Composition

To a 500 ml, four necked flask containing a stirrer was added 100 grams of DI water, 30 grams of a 1:1 isobutylene/maleic anhydride copolymer (having a number average molecular weight, $M_n$, of 1,700 and a weight average molecular weight, $M_w$, of 6,000) and 22 grams of diethanol amine. This mixture was heated at 95 C with stirring for 4 hours to give complete dissolution. The pH of this solution was 6.5.

EXAMPLE 7

Synthesis of Aqueous Binder Composition

To a 500 ml, four necked flask containing a stirrer is added 100 grams of DI water, 60 grams of a 50 wt % solution in xylene of a polymaleic anhydride polymer (having a weight average molecular weight, $M_w$, of 300-800) and 10 grams of diethanol amine. This mixture is heated at 95° C. for 4 hours and the aqueous phase containing the binder is recovered.

EXAMPLE 8

Dynamic Mechanical Testing on a Fiberglass Filter Paper Substrate Instrument Used A Dynamic Mechanical Analyzer ("DMA") available from TA Instruments, Inc. as Model # DMA 2980, using a dual cantilever clamp. In this geometry, the test sample was affixed at 3 points with the middle point oscillating at a given frequency. As crosslinking occurs in the test samples, the test sample exhibits increased dimensional stability and the oscillation of the middle point is dampened. This dampening behavior was converted into a response signal outputted by the DMA.

Test Conditions:

The temperature ramp used to perform the following analyses was 4° C./min from 30° C. to 250° C.

The substrate material used to prepare the test samples for the following analyses comprised two, staked pieces of Whatman® GF/B filter paper, 0.5"×1.34". To this substrate material was then added about 0.300 g (approx. 4 drops/piece of filter paper) of an aqueous solution containing a polymer (about 30 wt %) to provide the test sample for analysis. The results of the analyses of these test samples are provided in Table 1.

TABLE 1

| Polymer | Onset Temperature | Storage Modulus at 150° C. | pH |
|---|---|---|---|
| Control (polyacrylic acid/TEA) | 190° C. | 20 MPa | 4.5 |
| Control (polyacrylic acid/TEA) | 144° C. | 200 MPa | 3.0 |
| Example 1 | 90° C. | 240 MPa | 10.0 |
| Example 2 | 100° C. | 275 MPa | 10.0 |
| Example 3 | 110° C. | 150 MPa | 10.0 |
| Example 4 | 110° C. | 330 MPa | 10.0 |
| Example 5 | 138° C. | 500 MPa | 10.0 |

I claim:

1. A composite material comprising:
   (a) a substrate material selected from fibers, slivers, chips and combinations thereof; and,
   (b) a cured binder composition, wherein the cured binder composition is produced from an aqueous binder composition comprising an aqueous solvent, component X and a binder polymer polymerized from component Y and component Z; where component X comprises a base, a surfactant and combinations thereof; where component Y comprises at least one cyclic anhydride; and, where component Z comprises at least one of styrene, a styrene derivative, an α-olefin and an α-olefin derivative;
   wherein the composite material comprises ≦40 wt % cured binder composition and with the proviso that the cured binder composition contains <5 wt % crosslinking agent wherein the crosslinking agent contains at least two reactive groups capable of reacting with the carbonyl groups of the at least one cyclic anhydride of component Y.

2. The composite material of claim 1, wherein component X is a base selected from ammonia; ammonium hydroxide; ethyl amine; propyl amine; butyl amine; 2-Amino-2-methyl amine; 2-amino-1-butanol; 2-Amino-2-ethyl-1,3 propanediol; 2-Amino-2-methyl-1,3 propanediol; tris(hydroxymethyl)-aminomethane; an amino silane; sodium hydroxide, potassium hydroxide, tetramethylammoniun hydroxide and combinations thereof.

3. The composite material of claim 1, wherein the aqueous binder composition further comprises a crosslinking agent selected from hydroxyakylamides, ethylene diamine, lysine, epoxides, oxazolines, polyaxmines, oxazolidines, glycerol carbonates, poly butanediol bis amino benzoate, diethylene triamine and combinations thereof.

4. The composite material of claim 1, wherein the aqueous binder composition further comprises a silane coupling agent.

5. The composite material of claim 1, wherein the aqueous binder composition further comprises an additive, wherein the additive is selected from emulsifiers, pigments, fillers, extenders, antimigration aids, curing agents, coalescents, surfactants, spreading agents, dusting suppressing agents, biocides, plasticizers, organosilanes, antifoaming agents, corrosion inhibitors, colorants, antistatic agents, lubricants, waxes, antioxidants, coupling agents, polymers, waterproofing agents, wetting agents, lignin, and combinations thereof.

6. A product comprising the composite material of claim 1.

7. The product of claim 6, wherein the product is selected from chipboard, fiberboard, automotive interior lining, insulating material and fiber web.

8. The product of claim 6, wherein the product is selected from insulation, reinforcing mat for roofing or flooring applications, roving, microglass based substrate material for printed circuit boards, microglass based substrate material for battery separators, filter stock, tape stock, reinforcement scrim for cementitious or non-cementitious masonry coatings, ceiling tiles, cellulosic roofing tiles, window treatments and wall coverings.

9. A composite material comprising:
(a) a substrate material selected from fibers, slivers, chips and combinations thereof; and,
(b) a cured binder composition, wherein the cured binder composition is produced from an aqueous binder composition comprising an aqueous solvent, component X and a binder polymer polymerized from component Y and component Z; where component X is selected from ammonia, ammonium hydroxide, ethyl amine, propyl amine, butyl amine, sodium hydroxide, potassium hydroxide, tetramethylammonium hydroxide, a surfactant and combinations thereof; where component Y comprises at least one of a cyclic anhydride; and, where component Z comprises at least one of styrene, a styrene derivative, an α-olefin and an α-olefin derivative; and,
wherein the composite material comprises ≦40 wt % cured binder composition.

10. The composite material of claim 9, wherein component X is a base selected from ammonia, ammonium hydroxide, ethyl amine, propyl amine, butyl amine, sodium hydroxide, potassium hydroxide, tetramethylammonium hydroxide, and combinations thereof.

11. The composite material of claim 9, wherein the aqueous binder composition further comprises a crosslinking agent selected from hydroxyalkylamides, ethylene diamine, lysine, epoxides, oxazolines, polyamines, oxazolidines, glycerol carbonates, poly butanediol bis amino benzoate, diethylene triamine and combinations thereof.

12. The composite material of claim 9, wherein the aqueous binder composition further comprises a silane coupling agent.

13. The composite material of claim 9, wherein the aqueous binder composition further comprises an additive, wherein the additive is selected from emulsifiers, pigments, fillers, extenders, antimigration aids, curing agents, coalescents, surfactants, spreading agents, dusting suppressing agents, biocides, plasticizers, organosilanes, antifoaming agents, corrosion inhibitors, colorants, antistatic agents, lubricants, waxes, antioxidants, coupling agents, polymers, waterproofing agents, wetting agents, lignin, and combinations thereof.

14. A product comprising the composite material of claim 9.

15. The product of claim 14, wherein the product is selected from clipboard, fiberboard, automotive interior lining, insulating material and fiber web.

16. The product of claim 14, wherein the product is selected from insulation, reinforcing mat for roofing or flooring applications, roving, microglass based substrate material for printed circuit boards, microglass based substrate material for battery separators, filter stock, tape stock, reinforcement scrim for cementitious or non-cementitious masonry coatings, ceiling tiles, cellulosic roofing tiles, window treatments and wall coverings.

17. A method for preparing a composite material, comprising:
(a) providing an aqueous binder composition, wherein the aqueous binder composition comprises an aqueous solvent, component X and a binder polymer polymerized from component Y and component Z; where component X comprises at least one of a base and a surfactant; where component Y comprises at least one cyclic anhydride; and, where component Z comprises at least one of styrene, a styrene derivative, an α-olefin, and an α-olefin derivative;
(b) providing a substrate material selected from fibers, slivers, chips and combinations thereof;
(c) treating the substrate material with the aqueous binder composition; and,
(d) curing the aqueous binder composition;
wherein the composite material comprises ≦40 wt % of the cured binder composition.

* * * * *